(12) United States Patent
Halter

(10) Patent No.: US 7,523,377 B2
(45) Date of Patent: *Apr. 21, 2009

(54) RANDOM-ACCESS MULTI-DIRECTIONAL CDMA2000 TURBO CODE INTERLEAVER

(75) Inventor: Steven J. Halter, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 574 days.

This patent is subject to a terminal disclaimer.

(21) Appl. No.: 10/929,126

(22) Filed: Aug. 27, 2004

(65) Prior Publication Data

US 2005/0028065 A1 Feb. 3, 2005

Related U.S. Application Data

(63) Continuation of application No. 09/792,483, filed on Feb. 23, 2001, now Pat. No. 6,871,303.

(51) Int. Cl.
*H03M 13/00* (2006.01)

(52) U.S. Cl. .................. 714/755; 714/786; 714/788; 714/762; 714/701

(58) Field of Classification Search ......... 714/786–788, 714/755, 761–762, 759, 701; 711/157
See application file for complete search history.

(56) References Cited

U.S. PATENT DOCUMENTS

| | | | |
|---|---|---|---|
| 5,103,459 A | 4/1992 | Gilhousen et al. | |
| 5,392,299 A | 2/1995 | Rhines et al. | |
| 5,633,881 A | 5/1997 | Zehavi et al. | |
| 5,907,582 A | 5/1999 | Yi | |
| 5,949,796 A | 9/1999 | Kumar | |
| 5,978,365 A | 11/1999 | Yi | |

(Continued)

FOREIGN PATENT DOCUMENTS

EP 582827 2/1994

(Continued)

OTHER PUBLICATIONS

Donald Knuth, *The Art of Computer Programming*, Massachusetts, 624 pages, 1969.

(Continued)

*Primary Examiner*—Guy J Lamarre
(74) *Attorney, Agent, or Firm*—Stanton Braden; Ken Vu; Katherine Umpleby

(57) ABSTRACT

An interleaver that implements the LCS turbo interleaver algorithm utilized by the CDMA2000 standard is described. The interleaver includes a first computation unit for receiving an input address and computing a first sequential interleaved address during a first clock cycle in response thereto. A second computation unit is included for receiving an input address and computing a second sequential interleaved address during the first clock cycle in response thereto. The interleaver further includes a comparator for determining whether the first or the second sequential interleaved address is invalid and generating a signal in response thereto. The output of the comparator provides a control signal to a switch which selects the first or the second sequential interleaved address as an output interleaved address for the first clock cycle. The interleaver is further designed to move in a forward direction or a reverse direction.

12 Claims, 6 Drawing Sheets

U.S. PATENT DOCUMENTS

| | | | |
|---|---|---|---|
| 6,014,411 | A | 1/2000 | Wang |
| 6,304,991 | B1 | 10/2001 | Rowitch et al. |
| 6,430,722 | B1 | 8/2002 | Eroz et al. |
| 6,574,766 | B2 | 6/2003 | Obuchi et al. |
| 6,871,303 | B2 * | 3/2005 | Halter .................. 714/702 |

FOREIGN PATENT DOCUMENTS

| | | |
|---|---|---|
| JP | 10308676 | 11/1998 |
| WO | 0038333 | 6/2000 |

OTHER PUBLICATIONS

Bernard Sklar, *Digital Communications: Fundamentals and Applications*, New Jersey, pp. 245-380, 1998.

Sergio Benedetto, "Unveiling Turbo Codes: Some Results on Parallel Concatenated Coding Schemes," *IEEE Transactions on Information Theory*, vol. 42, No. 2, pp. 409-428, Mar. 1996.

Clark, et al. "Interleaver Structures for Coded Systems" Error Correction Coding for Digital Communications Plenum Press pp. 345-352 (1991).

Narayanan, Krishna, "A Novel ARQ Technique Using the Turbo Coding Principal" IEEE Communications Letter 1 (2):49-51 (Mar. 1997).

S. Dolinar and D. Divsalar, "Weight Disttributions for Turbo Codes Using Random and Nonrandom Permutations", TDA Progress Report 42-122, Aug. 15, 1995, pp. 56-6522 Jul. 2002.

International Search Report PCT/US02/005404—International Search Authority—European Patent Office Jan. 17, 2003.

* cited by examiner

RANDOM-ACCESS MULTI-DIRECTIONAL CDMA2000 TURBO CODE INTERLEAVER

CLAIM OF PRIORITY UNDER 35 U.S.C. §120

The present Application for Patent is a Continuation and claims priority to patent application Ser. No. 09/792,483, entitled "RANDOM-ACCESS MULTI-DIRECTIONAL CDMA2000 TURBO CODE INTERLEAVER" filed Feb. 23, 2001 now U.S. Pat. No. 6,871,303, now allowed, and assigned to the assignee hereof and hereby expressly incorporated by reference herein.

BACKGROUND

1. Field

The present invention pertains generally to communications systems, and more specifically to interleavers used in for turbo coding schemes in digital communication systems.

2. Background

Transmission of digital data is inherently prone to interference, which may introduce errors into the transmitted data. Error detection schemes have been suggested to determine as reliably as possible whether errors have been introduced into the transmitted data. For example, it is common to transmit data in packets and add to each packet a cyclic redundancy check (CRC) field, for example of a length of sixteen bits, which carries a checksum of the data of the packet. When a receiver receives the data, the receiver calculates the same checksum on the received data and verifies whether the result of the calculation is identical to the checksum in the CRC field.

When the transmitted data is not used on-line, it is possible to request retransmission of erroneous data when errors are detected. However, when the transmission is performed on-line, such as, e.g., in telephone lines, cellular phones, remote video systems, etc., it is not possible to request retransmission.

Convolutional codes have been introduced to allow receivers of digital data to correctly determine the transmitted data even when errors may have occurred during transmission. The convolutional codes introduce redundancy into the transmitted data and pack the transmitted data into packets in which the value of each bit is dependent on earlier bits in the sequence. Thus, when errors occur, the receiver can still deduce the original data by tracing back possible sequences in the received data.

To further improve the performance of a transmission channel, some coding schemes include interleavers, which mix up the order of the bits in the packet during coding. Thus, when interference destroys some adjacent bits during transmission, the effect of the interference is spread out over the entire original packet and can more readily be overcome by the decoding process. Other improvements may include multiple-component codes that encode the packet more than once, in parallel or in series. For example, it is known in the art to employ an error correction method that uses at least two convolutional coders in parallel. Such parallel encoding is commonly referred to as turbo coding.

For multiple-component codes, optimal decoding is often a very complex task, and may require large periods of time not usually available for on-line decoding. Iterative decoding techniques have been developed to overcome this problem. Rather than determining immediately whether received bits are zero or one, the receiver assigns each bit a value on a multilevel scale representative of the probability that the bit is one. A common scale, referred to as log-likelihood ratio (LLR) probabilities, represents each bit by an integer in some range, e.g., {−32,31}. A value of 31 signifies that the transmitted bit was a zero with very high probability, and a value of −32 signifies that the transmitted bit was a one, with very high probability. A value of zero indicates that the logical bit value is indeterminate.

Data represented on the multilevel scale is referred to as "soft data," and iterative decoding is usually soft-in/soft-out, i.e., the decoding process receives a sequence of inputs corresponding to probabilities for the bit values and provides as output corrected probabilities, taking into account constraints of the code. Generally, a decoder that performs iterative decoding uses soft data from former iterations to decode the soft data read by the receiver. During iterative decoding of multiple-component codes, the decoder uses results from decoding of one code to improve the decoding of the second code. When parallel encoders are used, as in turbo coding, two corresponding decoders may conveniently be used in parallel for this purpose. Such iterative decoding is carried out for a plurality of iterations until it is believed that the soft data closely represents the transmitted data. Those bits that have a probability indicating that they are closer to one (for example, between 0 and 31 on the scale described above) are assigned binary zero, and the remaining bits are assigned binary one.

"Turbo coding" represents an important advancement in the area of forward error correction (FEC). There are many variants of turbo coding, but most types of turbo coding use multiple encoding steps separated by interleaving steps combined with the use of iterative decoding. This combination provides previously unavailable performance with respect to noise tolerance in a communications system. Namely, turbo coding allows communications at levels of energy-per-bit per noise power spectral density ($E_b/N_0$) that were previously unacceptable using the existing forward error correction techniques.

Many communications systems use forward error correction techniques and therefore would benefit from the use of turbo coding. For example, turbo codes could improve the performance of wireless satellite links, in which the limited downlink transmit power of the satellite necessitates receiver systems that can operate at low $E_b/N_0$ levels.

Digital wireless telecommunication systems, for example, such as, e.g., digital cellular and PCS telephone systems, also use forward error correction. For example, the Telecommunications Industry Association has promulgated the over-the-air interface standard TIA/EIA Interim Standard 95, and its derivatives, such as, e.g., IS-95B (hereinafter referred to collectively as IS-95), which define a digital wireless communications system that uses convolutional encoding to provide coding gain to increase the capacity of the system. A system and method for processing radio-frequency (RF) signals substantially in accordance with the use of the IS-95 standard is described in U.S. Pat. No. 5,103,459, which is assigned to the assignee of the present invention and fully incorporated herein by reference.

There is an ongoing drive in the communications industry to continually improve coding gains. In conventional digital wireless communications systems, it has been found that a serial interleaver for turbo coding may be advantageously implemented with a congruent random sequence. It is known in the art that a uniform random sequence may be generated by using a linear congruential recursion algorithm. See, e.g., 2D. Knuth *The Art of Computer Programming* (1969) (describing generation of pseudo-random numbers with linear congruential recursion). It has also been found that a parallel turbo coder employing a two-dimensional interleaver (i.e., an interleaver organized as a rectangular data array comprising rows and columns) generally outperforms a parallel turbo coder having a one-dimensional interleaver (i.e., an interleaver in which the data is organized as a single, linear array) in terms of coding gain.

It would be advantageous to further enhance the performance of a turbo coder.

Additionally, as turbo coders are significantly more complex to implement than are convolutional coders, it would be desirable to provide a turbo coder implementation with reduced complexity. Thus, there is a need for a reduced-complexity, two-dimensional interleaver that uses multiple linear congruential sequences.

Cellular telecommunications systems are characterized by a plurality of mobile transceivers, such as mobile phones, in communication with one or more base stations. Each transceiver includes a transmitter and a receiver.

In a typical transceiver, an analog radio frequency (RF) signal is received by an antenna and downconverted by an RF section to an intermediate frequency (IF). Signal processing circuits perform noise filtering and adjust the magnitude of the signal via analog automatic gain control (AGC) circuitry. An IF section then mixes the signal down to baseband and converts the analog signal to a digital signal. The digital signal is then input to a baseband processor for further signal processing to output voice or data.

Similarly, the transmitter receives a digital input from the baseband processor and converts the input to an analog signal. This signal is then filtered and upconverted by an IF stage to an intermediate frequency. The gain of the transmit signal is adjusted and the IF signal is upconverted to RF in preparation for radio transmission.

The link between a transmitter and a receiver is a channel. One approach to increasing the information-carrying capacity of a channel between a base station and associated mobile stations is to enhance the signal-to-interference ratio (SIR). The SIR is often expressed as a ratio of the energy per information bit received to the interference density of the received signal. To increase system capacity, receivers in the mobile stations and base stations must effectively operate at lower signal-to-interference ratios (SIRs), or the SIR of the channel must be increased. To increase the SIR, the power of the transmitted signal is often increased, which is costly, increases the interference to other mobiles, and, thus, is impractical in many applications. Alternatively, special coding schemes are often employed in order to reduce the required SIR.

Coding for communications signals involves the addition of redundant information to the signals. By strategically adding redundancy to communications signals transmitted in noisy environments, errors introduced by a noisy channel are reduced to a desired level. As shown by Shannon in 1948, if the information rate of the communications signals is less than the channel capacity, the desired noise level is attainable without a reduction of the information rate. If redundancy is not employed in a noisy environment, error-free performance is difficult or impossible to obtain.

Many encoding and decoding systems are designed to control noise and interference related errors that occur during transmission of information in a communications system. Coding is an important consideration in the design of highly reliable modern digital communications systems.

The ability to operate efficiently in noisy or faded environments is particularly important in code division multiple access (CDMA) wireless communications systems where Raleigh-faded signal environments and co-channel interference from other users are common. Raleigh fading results from Doppler frequency shifts in the received signal due mobile station movement. Co-channel interference occurs when a CDMA communications system maintains multiple system users, with each additional user contributing incrementally to the co-channel interference. Co-channel interference is typically larger than other forms of channel noise such as additive white Gaussian noise (AWGN).

In a Raleigh-faded signal environment, the power levels of transmitted communications signals fluctuate in accordance with a Raleigh distribution. The power typically fluctuates over a dynamic range of 10 dB to 50 dB. The duration of the fades is a function of the velocity of a mobile station, i.e., cellular telephone, the frequency channel assigned to the mobile station, and overall signal environment. As the velocity of a mobile unit increases, fade duration decreases, leading to shorter error bursts. As the velocity of the mobile unit decreases, fade duration increases, leading to longer error bursts.

To improve the performance of a wireless communications system in a noisy and Raleigh-faded environment, interleavers following signal encoders are often employed. An interleaver spreads the codewords output from an encoder so that individual bits of a given codeword are separated from each other and transmitted at different times. As a result, individual bits of a given code experience independent fading, where the bits affected by an error burst belong to several codewords. At the receiver, the received signal samples are deinterleaved before decoding. Thus, the effect of the error burst is spread over the message so that it is possible to recover the data with the original error-correcting code. Several types of interleavers exist, including diagonal, convolutional, interblock, and block interleavers.

Turbo codes are serial or parallel concatenations of two or more constituent codes, separated by one or more code interleavers. Turbo encoders and decoders are often employed to improve error control and to reduce the required SIR. Turbo codes are often decoded with a relatively efficient iterative algorithm to achieve low error rates at signal-to-noise (SNR) ratios approaching the Shannon limit. As an essential part of the Turbo code, code interleavers and deinterleavers must be inserted between the component code encoders and decoders, respectively. The performance of turbo codes depends on the length and structure of the code interleavers. Good turbo code performance has been achieved in the past using interleavers having pseudo random structures.

U.S. patent application Ser. No. 09/205,511, filed Dec. 4, 1998 by D. Rowitch et al. and entitled "TURBO CODE INTERLEAVER USING LINEAR CONGRUENTIAL SEQUENCES," now U.S. Pat. No. 6,304,991, issued Oct. 16, 2001 to Rowitch et al., the teachings of which are incorporated herein by reference, discloses and claims a particularly advantageous interleaver design. The interleaver of Rowitch et al. offers numerous benefits based on simulations running on personal computers. Nevertheless, there is a need to implement the interleaver efficiently in hardware (i.e., cellular telephones).

Hence, a need remains in the art for a system or method for implementing the teachings of Rowitch et al. efficiently in hardware such that the teachings can be incorporated into an integrated circuit or chip that could be used in a cellular phone.

SUMMARY

The need in the art is addressed by the interleaver of the present invention. The inventive interleaver includes a first computation unit for receiving an input address and computing a first sequential interleaved address during a first clock cycle in response thereto. A second computation unit is included for receiving an input address and computing a second sequential interleaved address during the first clock cycle in response thereto. The inventive interleaver further includes a comparator for determining whether the first or the second sequential interleaved address is invalid and generating a signal in response thereto. The output of the comparator provides a control signal to a switch which selects the first or the second sequential interleaved address as an output interleaved address for the first clock cycle.

In the illustrative embodiment, the first and second computation units implement the expression:

$$A=\text{bitrev (row)} \cdot 2^c + \{(col+1) \cdot c(i)\} \bmod C,$$

where A is the interleaved address, 'row' is the 5 LSBs, 'col' is the c MSBs of the input linear address, C is the number of columns, and c(i) is the output of the lookup-table where "i" is the current row number.

The inventive interleaver is designed to move in a forward direction or a reverse direction with respect to the input addresses in response to a direction control signal. A mechanism is included for providing an address offset with respect to the input address. The address offset storage with the ability to load the counter allows the interleaver to start at any desired point in the interleaver sequence. From the algorithm patented by Rowitch et al, the interleaver has to be run from the start to the end. There is no specified method for starting at a random point in the sequence. By pre-storing the address offsets for desired points in the interleaver sequence, the interleaver sequence can be started at those desired points, running either in the forward or backward direction.

The inventive interleaver provides a unique implementation of the LCS turbo interleaver algorithm utilized by the CDMA2000 standard.

DETAILED DESCRIPTION

Figure 1:
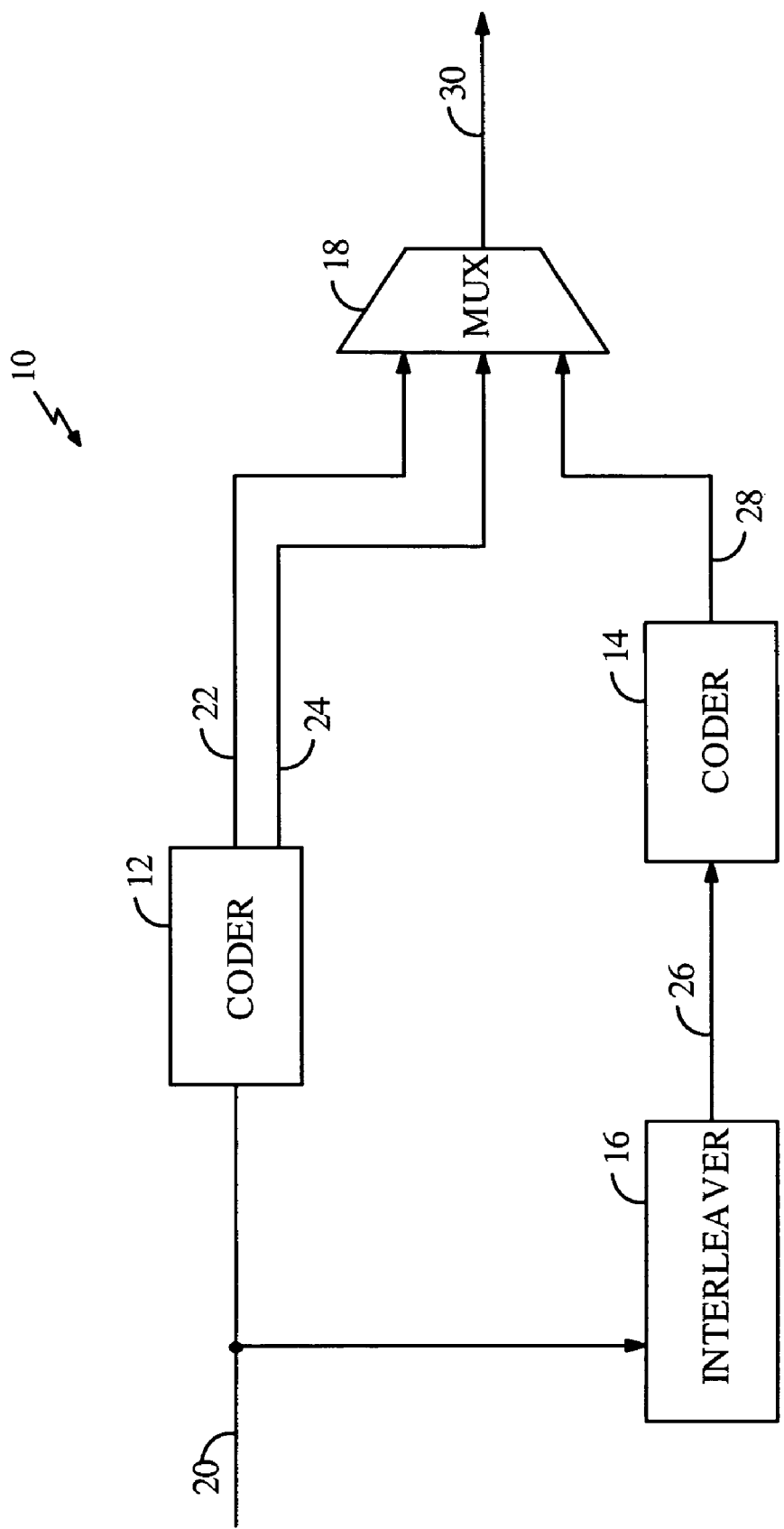
FIG. 1 is a block diagram of a parallel concatenated turbo coder.

In accordance with one embodiment, as illustrated in FIG. 1, a parallel concatenated turbo encoder 10, or turbo coder 10, includes first and second coders 12, 14, an interleaver 16, and a multiplexer 18. The first coder 12 and the interleaver 16 are configured to receive encoder input data 20, which is typically user information or control data. The first coder 12 outputs systematic symbols 22, which are typically a copy of the original input bits 20, and parity symbols 24. The second coder 14 is configured to receive an interleaved output 26 of the interleaver 16 and to output a second set of parity symbols 28. The systematic symbols (not shown) generated by the second coder 14 are suppressed, and the remaining respective outputs 22, 24, 28 of the first and second coders 12, 14 are multiplexed by the multiplexer 18 into an output data stream 30.

Additional coder and interleaver pairs may be added in parallel to reduce the coding rate, thereby providing enhanced forward error correction. Alternatively, some of the systematic symbols 22 and/or parity symbols 24 may be punctured to increase the coding rate and provide improved spectral efficiency.

The first and second coders 12, 14 may be various types of coders known in the art, including block coders and convolutional coders. Exemplary block coders and convolutional coders are described in Bernard Sklar, *Digital Communications* 245-380 (1988), which is incorporated herein by reference. The first and second coders 12, 14 are advantageously convolutional coders with relatively small constraint lengths K such as, e.g., K=4, thereby providing reduced complexity because the low constraint lengths reduce the complexity of the corresponding decoders (not shown). The first and second coders 12, 14 are also advantageously recursive systematic convolutional (RSC) encoders, as known in the art. The interleaver 16 is advantageously a two-dimensional interleaver, as described below.

Typically, the first and second coders 12, 14 output two parity symbols 24, 28 for each bit 20 received, yielding a coding rate R=½ for each coder 12, 14. Nevertheless, the total coding rate for the turbo coder 10 is R=⅓ because the systematic bit from the second coder 14 is punctured.

Figure 2:
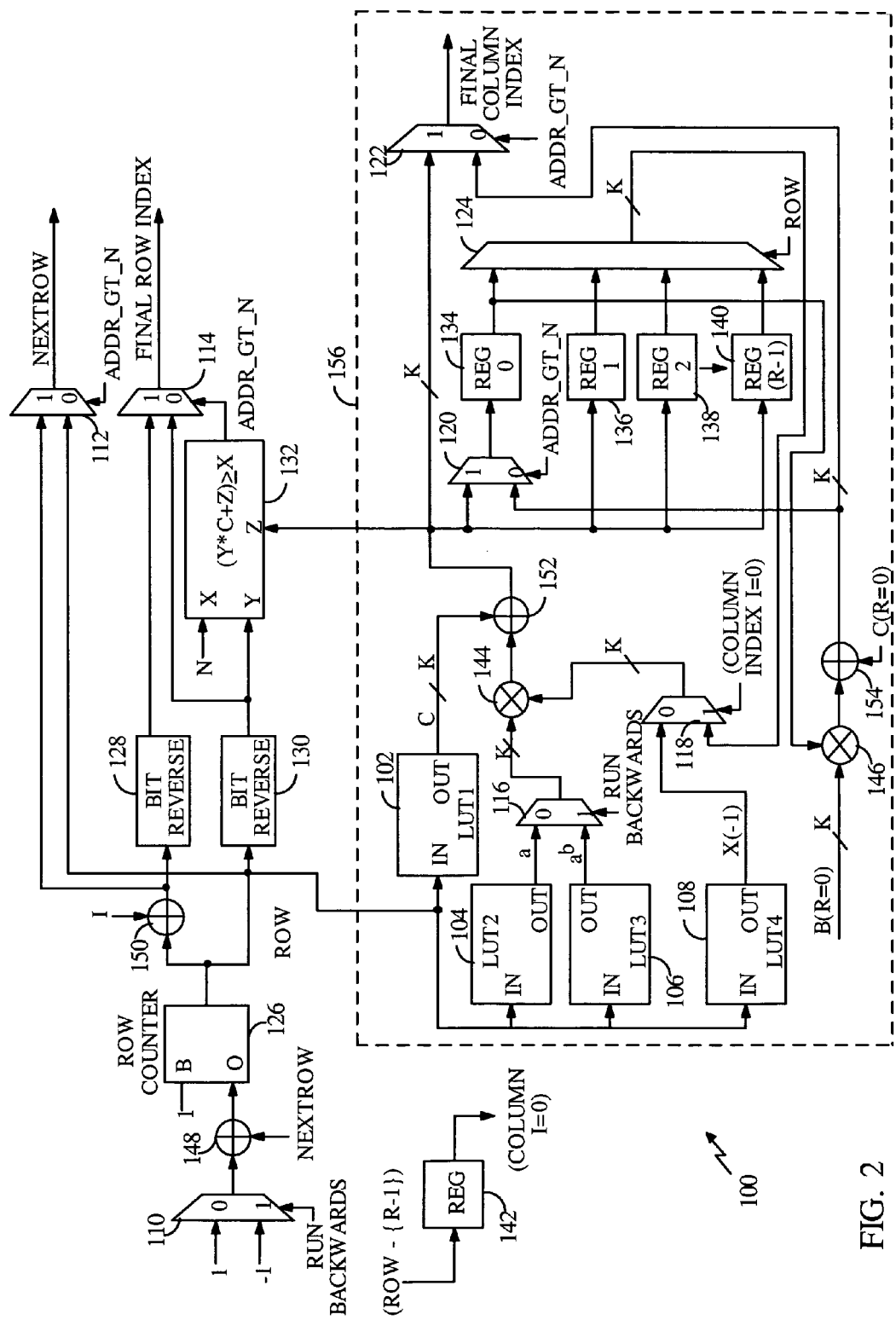
FIG. 2 is a block diagram of an interleaver that may be used in the parallel concatenated turbo coder of FIG. 1.

As shown in FIG. 2, a two-dimensional (2-D), linear congruential sequence (LCS) interleaver 100 in accordance with one embodiment includes four lookup tables (LUTs) 102, 104, 106, 108, seven two-input multiplexers (MUXes) 110, 112, 114, 116, 118, 120, 122, an R-input MUX 124, a row counter 126, first and second bit-reversal logic blocks 128, 130, an address validation module 132, a plurality, R, of column index, or row, registers 134, 136, 138, 140 (shown for simplicity as four registers), a register 142 for flagging column index reset, first and second k-bit multipliers 144, 146, and four k-bit adders 148, 150, 152, 154. An LCS recursion generator 156 is depicted by a dashed-line enclosure. The interleaver 100 may be used in the parallel concatenated turbo coder of FIG. 1, or alternatively, the interleaver 100 may be used in a serial concatenated turbo coder in which the interleaver 100 is positioned the outer and the inner component codes, as would be understood by those skilled in the art.

The size of the interleaver 100 is N, which is less than or equal to $2^m$ and greater than $2^{m-1}$. The number of rows, R, multiplied by the number of columns, C, equals $2^m$. The number of columns, C, equals $2^k$, i.e., $k=\log_2 C$. The number of rows, R, equals $2^r$, i.e., $r=\log_2 R$.

The address validation module 132 may advantageously be implemented as discrete gate logic configured as a shift register and an adder. The address validation module 132 serves to check whether an X input is less than the product of a column number C and a Y input (a row index), summed with a Z input (a column index), performing, e.g., a shift and add function. The address validation module 132 serves to generate a flag that indicates whether the address is invalid, i.e., whether the address contains bits in excess of a power of 2 (i.e., whether the interleaver size is between successive powers of 2) that should be discarded.

The LCS recursion generator 156 serves to pseudo-randomly rearrange, or shuffle, the bit values contained in each row of the interleaver 100, as described below, by receiving a row number value at the inputs to the four LUTs 102, 104, 106, 108 and generating a column index (the Z input to the address validation module 132). Those skilled in the art would understand that in a parallel concatenated turbo coder such as illustrated in FIG. 1, a physical rearrangement of the data elements may advantageously be circumvented in favor of using the pseudo-randomly generated LCS on the read addressed by the second encoder. The first and second bit-reversal logic blocks 128, 130 serve to rearrange, or shuffle, the rows within the interleaver 100 in accordance with a predefined bit-reversal rule, as described below and as known in the art.

The LUTs 102, 104, 106, 108 may be implemented as any storage media known in the art. The first LUT 102 is used to store values of a coefficient c. The second LUT 104 is used to store values of a coefficient a. The third LUT 106 is used to store values of a coefficient a taken to the power of a coefficient b. The fourth LUT 108 is used to store values of x(−1). The size of each LUT 102, 104, 106, 108 is r×k bits. Total memory requirements for the interleaver 100 are 4r×k bits plus r×k register bits for the registers 134, 136, 138, 140.

The register 142 receives a bit value specifying the row number, which is set initially to R−1. With each processing cycle, the register 142 outputs a bit value signifying the column number, which is initially set not equal to zero. The register 142 thereby serves to reset the column index each time the row number cycles through all of the rows.

With each processing cycle, the input MUX 110 generates a value of either 1 or −1, depending upon whether a RunBackwards flag is set. The value is provided to the adder 148, which adds the value to a bit value denoted NextRow. The resultant sum is provided to a data input of the row counter 126. A value of 1 is provided to a second input of the row counter 126. The row counter 126 produces a row value (stored initially as R−1 in the register 142), which is provided to the second bit-reversal logic block 130. The row value is also provided to each of the LUTs 102, 104, 106, 108. The row value is also provided to the adder 150, which adds the row value to a value of 1, and provides the resultant sum to the first bit-reversal logic block 128. This resultant sum is also provided to a first input of the MUX 112.

With each processing cycle, the first bit-reversal logic block 128 provides a value to a first input of the MUX 114. The second bit-reversal logic block 130 provides a row index value to a second input of the MUX 114, and also to a Y input of the address validation module 132. The address validation module 132 receives the value N at an X input. The address validation module 132 receives a value based upon the stored coefficients at a Z input. The LCS address validation module 132 calculates the product of C and the Y-input value, adds the product to the Z-input value, and checks whether the result is greater than or equal to the X-input value, N. If the computed value is greater than or equal to N, the address validation module 132 outputs a value of 1. Otherwise, the value of the output is 0. The output value is a flag denoted Addr_GT_N, which, when set to 1, signifies that the interleaver size is between successive powers of 2 such that the excess bits beyond the lower power of 2 should be discarded.

The Addr_GT_N value is provided as a selector input to the MUXes 112, 114, 120, and 122. The MUX 112 selects its first input if the Addr_GT_N value is set to 1. The selected input that is output from the MUX 112 is the interleaved NextRow value. The MUX 114 selects its first input if the Addr_GT_N value is set to 1. The selected input that is output from the MUX 114 represents is a final row index value.

The LCS recursion generation is performed as follows. With each processing cycle, a k-bit value representing the coefficient c is sent from the first LUT 102 to the data-path k-bit adder 152. The value a is sent from the second LUT 104 to a first input of the MUX 116. A value representing a taken to the power b is sent from the third LUT 106 to a second input of the MUX 116. The MUX 116 receives the RunBackwards flag at a selector input. If the RunBackwards value is 1, the MUX 116 selects its second input and provides the selected value, a k-bit value, to the multiplier 144. Otherwise, the MUX 116 provides its first input, a k-bit value, to the multiplier 144. The value x(−1) is sent from the fourth LUT 108 to a first input of the MUX 118. The MUX 118 receives at a second input a k-bit value output from the MUX 124. The MUX 118 receives a column index value at a selector index. The column index value is initially set not equal to zero. If the column index value is 1, the MUX 118 selects its second input. Otherwise, the MUX 118 selects its first input. The selected input value, a k-bit value, is provided to the multiplier 144. The resultant product from the multiplier 144 is provided to the k-bit adder 152. Advantageously, the data-path k-bit adder 152 is a programmable adder/subtractor, as known in the art. When the interleaver 100 is running backward, the adder 152 subtracts the value c.

The k-bit adder 152 provides an output value with each processing cycle to the Z input of the address validation module 132. The output of the adder 152 is also provided to a first input of the MUX 120 and to each of the first through the (R−1)th row registers 136, 138, 140. The output of the adder 152 is also provided as a k-bit input value to a first input of the MUX 122.

The MUX 120 receives a second input value from the k-bit adder 154. If the selector input of the MUX 120 is set to 1, the MUX 120 selects its first input. Otherwise, the MUX 120 selects its second input. The selected input is provided to the zero-th row register 134. Each row register 134, 136, 138, 140 provides an output value to respective inputs of the MUX 124. Additionally, the output value from the zero-th row register 134 is provided to the multiplier 146. The MUX 124 receives the row value (the output of the row counter 126) at a selector input. The row-register input selected by the MUX 124 depends upon the value of the row value at the selector input. Thus, each row register 134, 136, 138, 140 is updated when the row value is equal to the respective row register number, and the zero-th row register 134 is also enabled when the flag Addr_GT_N is equal to zero.

A k-bit initial input value b for R=0 is provided to the multiplier 146. The multiplier 146 also receives a value output from the zero-th row register 134. The multiplier 146 multiplies the two received values together and provides the resultant product to the k-bit adder 154. The data-path k-bit adder 154 also receives an initial input value c for R=0. Advantageously, the data-path k-bit adder 154 is a programmable adder/subtractor, as known in the art. When the interleaver 100 is running backward, the adder 154 subtracts the initial value c. The adder 154 sums (or, as programmed, subtracts) the two received values. The resultant sum, a k-bit value, is provided to a second input of the MUX 122.

The MUX 122 selects its first input if its selector input is set to 1. Otherwise, the MUX 122 selects its second input. The MUX 122 outputs the selected input as a final column index value. The address for the next bit value is the product of R and the final row index value output from the MUX 122, summed with the final column index value output from the MUX 114.

In one embodiment an LCS with period M is recursively generated according to the following identity:

$$x(n+1) = (ax(n) + c)_{mod\, M}$$

with integers a, c, and M satisfying the following three conditions: (1) c must be relatively prime to M. (2) a−1 must be a multiple of p, where p is any prime number that divides M. When M is a multiple of 4, a−1 must be a multiple of 4. (3) x(0) is the seed value, which can be any integer. To simplify the implementation, M may advantageously be chosen to be a power of 2. Thus, a must be in the form of 4p+1, while c can be taken as any odd number. It should be noted that while x(0) is used above to denote the initial condition, x(−1) is used to denote the initial condition in the embodiment described in connection with FIG. 2. No significance is to be attached to the different numbers used.

A 2-D, LCS interleaver in accordance with one embodiment is specified as follows: Letting the interleaving size be K=$2^N$, the interleaver is specified as a rectangular matrix with R rows and C columns, where both R and C are given by powers of 2. The data to be interleaved is written into the matrix row by row. The rows of data are first permutated (i.e., interleaved) according to any conventional interleaving rule. Advantageously, the rows of data are permutated according to a bit-reversal rule applied to the row index. Within each row the columns (i.e., the data elements, as each column has one data element per row) are permutated according to the rule specified by an associated LCS. The LCSs associated with two distinct rows are advantageously different, but may, in the alternative, be the same. After permutation of all of the rows, the data is read out in a column-by-column fashion to yield an interleaved sequence. As those of skill in the art would understand, an interleaver with length less than $2^N$ and greater than $2^{N-1}$ can be generated by deleting the invalid addresses from an interleaver of length of $2^N$.

In one embodiment a 2-D, LCS interleaver includes the following specifications: The interleaver size is 32 (i.e., N=5), and the data array is defined as {d(0), d(1), d(2), ... d(31)}. The interleaver is organized as an array with four rows and eight elements per row. The data elements are filled row by row in the following manner:

$$\begin{pmatrix} d(0) & d(1) & d(2) & d(3) & d(4) & d(5) & d(6) & d(7) \\ d(8) & d(9) & d(10) & d(11) & d(12) & d(13) & d(14) & d(15) \\ d(16) & d(17) & d(18) & d(19) & d(20) & d(21) & d(22) & d(23) \\ d(24) & d(25) & d(26) & d(27) & d(28) & d(29) & d(30) & d(31) \end{pmatrix}.$$

The row indexes in binary (00, 01, 10, 11) may advantageously be bit reversed (i.e., 00, 10, 01, 11) and the rows are permuted accordingly to obtain $$\begin{pmatrix} d(0) & d(1) & d(2) & d(3) & d(4) & d(5) & d(6) & d(7) \\ d(16) & d(17) & d(18) & d(19) & d(20) & d(21) & d(22) & d(23) \\ d(8) & d(9) & d(10) & d(11) & d(12) & d(13) & d(14) & d(15) \\ d(24) & d(25) & d(26) & d(27) & d(28) & d(29) & d(30) & d(31) \end{pmatrix}.$$

The bit reversal serves to shuffle rows of the interleaver in accordance with a predefined bit-reversal algorithm. Application of a bit reversal algorithm provides desirable time separation between the rows of the interleaver. Nevertheless, bit reversal is not necessary for implementation of the interleaver.

In a particular embodiment, the permutation LCSs are generated according to the following equations:

$x_1(n+1)=(5x_1(n)+7)_{mod\ 8}$, with $x_1(0)=3$, $x_2(n+1)=(x_2(n)+5)_{mod\ 8}$, with $x_2(0)=0$, $x_3(n+1)=(5x_3(n)+3)_{mod\ 8}$, with $x_3(0)=4$, and $x_4(n+1)=(x_4(n)+3)_{mod\ 8}$, with $x_4(0)=3$.

The permutation patterns are given by {3, 6, 5, 0, 7, 2, 1, 4}, {0, 5, 2, 7, 4, 1, 6, 3}, {4, 7, 6, 1, 0, 3, 2, 5}, and {7, 2, 5, 0, 3, 6, 1, 4} for the four rows, respectively. Therefore, after applying the column permutation, the first row becomes (d(3) d(6) d(5) d(0) d(7) d(2) d(1) d(4)), the second row becomes (d(16) d(21) d(18) d(23) d(20) d(17) d(22) d(19)), the third row becomes {d(12) d(15) d(14) d(9) d(8) d(11) d(10) d(13)}, and the fourth row becomes {d(31) d(26) d(29) d(24) d(27) d(30) d(25) d(28)}.

After all of the columns are permutated within their respective rows, the interleaved data matrix has the following form:

$$\begin{pmatrix} d(3) & d(6) & d(5) & d(0) & d(7) & d(2) & d(1) & d(4) \\ d(16) & d(21) & d(18) & d(23) & d(20) & d(17) & d(22) & d(19) \\ d(12) & d(15) & d(14) & d(9) & d(8) & d(11) & d(10) & d(13) \\ d(31) & d(26) & d(29) & d(24) & d(27) & d(30) & d(25) & d(28) \end{pmatrix}.$$

The data in the interleaved matrix is read out column by column, yielding the following interleaved sequence: {d(3), d(16), d(12), d(31), d(6), d(21), d(15), d(26), d(5), d(18), d(14), ..., d(11), d(30) d(1), d(22), d(10), d(25), d(4), d(19), d(13), d(28)}. If an interleaver of length 30 is desired, the interleaver generated as described above can be shortened by deleting the data elements d(30) and d(31), producing the following interleaved sequence: {d(3), d(16), d(12), d(6), d(21), d(15), d(26), d(5), d(18), d(14), ..., d(11), d(1), d(22), d(10), d(25), d(4), d(19), d(13), d(28)}.

The LCSs employed in the interleaver construction can be generated either forward or backward, as desired, for optimum use with MAP decoders in turbo decoding. In one embodiment the reverse sequence generation is given by the following equation:

$x(n)=(\alpha^\beta x(n+1)-c)_{mod\ M}$, where $\beta=(M/2)-1$.

It should be noted that the term β, as used the above equations, represents the coefficient b described in connection with the embodiment of FIG. 2.

Thus, generation of the LCS requires that each interleaver be uniquely defined by 3R parameters, where R is the number of rows. A relatively short, $\log_2(C) \times \log_2(C)$ multiplier is needed. Due to the modulo operation, it is not necessary to generate the bits above bit location $\log_2(C)$. One set of R registers is needed to hold the intermediate results of the R congruent sequences.

With different parameters x(0), a, and b for each row, there are many different possibilities for the permutation sequences. It is desirable to perform a search to optimize the interleaver parameters for use with specific turbo codes.

Figure 3:
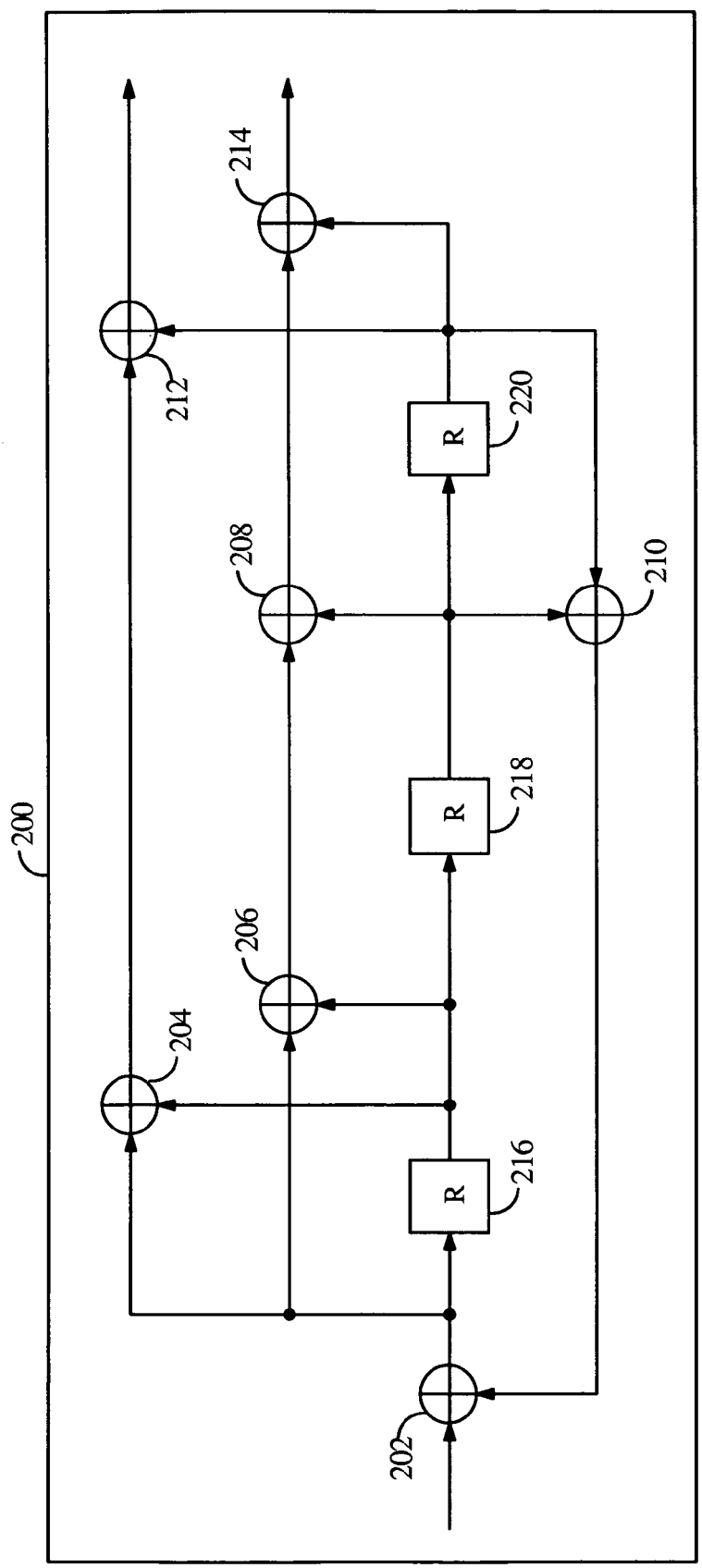
FIG. 3 is a block diagram of a constituent encoder that may be used in conjunction with the interleaver of FIG. 2.

In FIG. 3 a constituent encoder 200 in accordance with one embodiment is optimized for a specific turbo code used in a CDMA digital wireless communications system. The encoder 200 includes seven modulo-2 adders 202, 204, 206, 208, 210, 212, 214 and three bit locations 216, 218, 220. The bit locations 216, 218, 220 may be implemented as a three-bit shift register, or alternatively, three one-bit shift registers. The modulo-2 adders 202, 204, 206, 208, 210, 212, 214 are coupled to the bit locations 216, 218, 220 in a precise manner so as to produce a desired set of feedback taps. Thus, the adder 202 is configured to receive an input bit. The adder 202 is also coupled to the bit location 216 and to the adders 204 and 206. The bit location 216 is coupled to the bit location 218 and to the adders 204 and 206. The bit location 218 is coupled to the bit location 220 and to the adders 208 and 210. The adder 210 is coupled to the adder 202. The adder 204 is coupled to the adder 212. The adder 206 is coupled to the adder 208. The adder 208 is coupled to the adder 214. The bit location 220 is coupled to the adders 210, 214, and 212. The adders 212, 214 are configured to output, respectively, first and second symbols.

It is known in the art that error performance can be characterized by the input and output weight of error events in the constituent decoders (not shown). See, e.g., S. Benedetto & G. Montorsi, *Unveiling Turbo Codes: Some Results on Parallel Concatenated Coding Schemes*, 42 IEEE Trans. Info. Theory 409-28 (March 1996). The input weight of an error event is the number of bit errors, whereas the output weight of an error event is the number of code symbol errors. An error event of input weight 1 clearly will diverge from the all-zeros state and never remerge (the 1 will cycle endlessly in the shift register, accumulating more and more output weight along the way). This is due to the recursive, or feedback, portion of the encoder. Due to this structure, it has been shown that the performance of turbo codes at high signal-to-noise-ratio (SNR) is dominated by output error events with input weight 2. See id. The turbo code error floor can be accurately predicted using the so-called effective free distance asymptote. The effective free distance is the minimum output weight of all error events of input weight 2. The input weight 2 error events that are short in length will, typically, cause the minimum distance error events. For the encoder 200 of FIG. 3, the feedback polynomial is $1+D^2+D^3$, and all possible input weight 2 error events are of the form $D^k(1+D^{7j})$, where j=1,2, . . . and k is an arbitrary shift in the range 0, . . . , K−7j (K is assumed to be the interleaver size). This can be easily verified by examining the trellis of the constituent encoder 200, as would be understood by those of skill in the art.

It should be noted that the interleaver size for the embodiment of FIG. 3 is denoted K, while the interleaver size for the embodiment of FIG. 2 is denoted N. Those of skill would appreciate that no special significance is to be imported to the fact that different letters are used.

Suppose, for example, that an error pattern of $D^k(1+D^7)$ causes a minimum distance error event out of the first decoder. The turbo interleaver will map the two errors ($D^k$, $D^{k+7}$) into two positions ($D^n$, $D^m$). If $|m-n|=7$ or some multiple of 7, a low distance error event out of the second decoder is likely. The fundamental purpose of the turbo interleaver is to prevent such mappings from occurring. Namely, the interleaver should advantageously map collections of bits that are prone to low weight error events in the first dimension into collections of bits that generate a large amount of output weight in the second dimension. Therefore, a desirable approach to design of the interleaver is to try to prevent bit pairs located at indices (k, k+7j) from mapping into bit pairs located at indices (s, s+7t), with particular emphasis on the smaller values of j and t. Such input error events are listed in Table 1, below. For each event, the output parity weight of the first constituent code is listed, using the appropriate puncturing patterns for the rate ½, ⅓, and ¼ forward-link turbo codes, as specified in IS-95.

TABLE 1

Input Weight 2 Error Events

| | | 1st Constituent Output Weight | | |
|---|---|---|---|---|
| Input Error Event | Input Length | Rate ½ | Rate ⅓ | Rate ¼ |
| $D^k(1 + D^7)$ | 8 | 3 | 6 | 8 |
| $D^k(1 + D^{14})$ | 15 | 6 | 10 | 16 |
| $D^k(1 + D^{21})$ | 22 | 7 | 14 | 20 |
| $D^k(1 + D^{28})$ | 29 | 10 | 18 | 28 |

If a given interleaver contains an input weight 2→2 mapping of the form $D^{k_1}(1+D^7) \to D^{k_2}(1+D^7)$, then the composite output weight of the resulting error event will be 2+3+3=8 for a rate ½ turbo code. In the previous calculation, the weight of the systematic bits (2) is summed with the respective parity weight from the two constituent encoders (3 and 3). Similarly, if the interleaver contains an input weight 2→2 mapping of the form $D^{k_1}(1+D^7) \to D^{k_2}(1+D^{14})$, then the composite output weight of the resulting error event will be 2+3+6=11 for a rate ½ turbo code, or 2+6+10=18 for a rate ⅓ turbo code.

In addition, it is possible that input weight 4 error events of low constituent output weight may map into two input weight 2 error events of low output weight in the second dimension. Such mappings are denoted by 4→{2,2}. While there is no closed-form solution for constituent error events of input weight 4, the following table contains some of the low output weight error events for the constituent encoder 200, with the constituent encoder 200 being used as the first constituent encoder for forward-link turbo codes in a CDMA digital wireless communications system using an over-the-air interface derived from IS-95.

TABLE 2

Input Weight 4 Error Events

| | | 1st Constituent Output Weight | | |
|---|---|---|---|---|
| Input Error Event | Input Length | Rate ½ | Rate ⅓ | Rate ¼ |
| $D^k(1 + D^3 + D^4 + D^5)$ | 5 | 2 | 4 | 6 |
| $D^k(1 + D^1 + D^3 + D^6)$ | 6 | 2 | 4 | 8 |
| $D^k(1 + D^2 + D^4 + D^8)$ | 8 | 2 | 4 | 8 |
| $D^k(1 + D^1 + D^4 + D^9)$ | 9 | 2 | 4 | 8 |
| $D^k(1 + D^5 + D^{10} + D^{11})$ | 11 | 2 | 8 | 12 |
| $D^k(1 + D^1 + D^2 + D^4)$ | 4 | 3 | 4 | 6 |
| $D^k(1 + D^2 + D^5 + D^6)$ | 6 | 3 | 4 | 8 |

TABLE 2-continued

Input Weight 4 Error Events

| Input Error Event | Input Length | 1st Constituent Output Weight | | |
|---|---|---|---|---|
| | | Rate 1/2 | Rate 1/3 | Rate 1/4 |
| $D^k(1+D^1+D^6+D^{10})$ | 10 | 3 | 4 | 8 |
| $D^k(1+D^4+D^8+D^9)$ | 9 | 3 | 8 | 10 |
| $D^k(1+D^1+D^3+D^{13})$ | 13 | 3 | 8 | 12 |
| $D^k(1+D^5+D^9+D^{13})$ | 13 | 3 | 8 | 12 |
| $D^k(1+D^2+D^4+D^{15})$ | 15 | 3 | 8 | 12 |
| $D^k(1+D^8+D^{14}+D^{15})$ | 15 | 3 | 8 | 12 |
| $D^k(1+D^6+D^9+D^{12})$ | 12 | 3 | 8 | 14 |
| $D^k(1+D^2+D^{12}+D^{13})$ | 13 | 3 | 8 | 14 |
| $D^k(1+D^6+D^{10}+D^{15})$ | 15 | 3 | 8 | 14 |
| $D^k(1+D^1+D^7+D^8)$ | 8 | 4 | 4 | 8 |
| $D^k(1+D^5+D^6+D^9)$ | 9 | 4 | 8 | 10 |
| $D^k(1+D^1+D^2+D^{11})$ | 11 | 4 | 8 | 10 |
| $D^k(1+D^4+D^7+D^{11})$ | 11 | 4 | 8 | 10 |
| $D^k(1+D^8+D^9+D^{11})$ | 11 | 4 | 8 | 10 |
| $D^k(1+D^2+D^7+D^9)$ | 9 | 4 | 8 | 12 |
| $D^k(1+D^3+D^7+D^{10})$ | 10 | 4 | 8 | 12 |
| $D^k(1+D^6+D^8+D^{10})$ | 10 | 4 | 8 | 12 |
| $D^k(1+D^2+D^5+D^{13})$ | 13 | 4 | 8 | 12 |
| $D^k(1+D^3+D^8+D^{13})$ | 13 | 4 | 8 | 12 |
| $D^k(1+D^6+D^7+D^{13})$ | 13 | 4 | 8 | 12 |
| $D^k(1+D^9+D^{12}+D^{13})$ | 13 | 4 | 8 | 12 |
| $D^k(1+D^1+D^6+D^{17})$ | 17 | 4 | 8 | 12 |
| $D^k(1+D^8+D^{13}+D^{17})$ | 17 | 4 | 8 | 12 |
| $D^k(1+D^2+D^6+D^{12})$ | 12 | 4 | 8 | 14 |
| $D^k(1+D^5+D^7+D^{12})$ | 12 | 4 | 8 | 14 |
| $D^k(1+D^1+D^{14}+D^{15})$ | 15 | 4 | 8 | 14 |
| $D^k(1+D^2+D^{11}+D^{15})$ | 15 | 4 | 8 | 14 |
| $D^k(1+D^6+D^{12}+D^{16})$ | 16 | 4 | 8 | 14 |
| $D^k(1+D^5+D^{13}+D^{16})$ | 16 | 4 | 12 | 18 |
| $D^k(1+D^5+D^{14}+D^{19})$ | 19 | 4 | 12 | 18 |
| $D^k(1+D^6+D^9+D^{19})$ | 19 | 4 | 12 | 18 |

If, for example, the interleaver contains an input weight $4 \rightarrow \{2,2\}$) mapping of the form $D^{k_1}(1+D^3+D^4+D^5) \rightarrow \{D^{k_2}(1+D^7), D^{k_3}(1+D^7)\}$, then the composite output weight of the resulting error event will be 4+2+3+3=12 for a rate ½ turbo code. This composite error event is not much worse than the error event due to the mapping $D^{k_1}(1+D^7) \rightarrow D^{k_2}(1+D^{14})$, which has composite output weight 11. A primary design goal is, therefore, to optimize the parameters of the interleaver such that the above-described types of bad mappings are avoided, or at least minimized. Ideally, the bad mappings having the lowest composite output weight are the mappings most important to avoid and/or minimize. In designing an interleaver for a particular size (e.g., 1530) it is possible to optimize interleaver parameters so as to minimize both types of mappings (i.e., weight $2 \rightarrow 2$ and weight $4 \rightarrow \{2,2\}$). This approach yields the optimal interleaver for that particular size. It should be pointed out that in designing an interleaver of size $2^N$ that can be robustly punctured down to any size greater than $2^{N-1}$ (which is referred to as a "puncture-friendly" interleaver) optimization for weight $4 \rightarrow \{2,2\}$) mappings may be more difficult to achieve.

A search was performed to obtain puncture-friendly interleavers of size $2^N$ from a 2-D, LCS interleaver in accordance with the embodiment of FIG. 3. Table 3, below, contains initial results of the search. For each interleaver size, the number of rows used and the number of columns used are specified along with the x(0), a, and c coefficients. For simplicity and efficiency in implementation, thirty-two rows were used for all interleavers.

TABLE 3

2-D LCS Interleaver Coefficients

| K = 512, 32 × 16 | | | K = 1024, 32 × 32 | | | K = 2048, 32 × 64 | | | K = 4096, 32 × 128 | | |
|---|---|---|---|---|---|---|---|---|---|---|---|
| x(0) | a | c | x(0) | a | c | x(0) | a | c | x(0) | a | c |
| 14 | 9 | 11 | 30 | 29 | 9 | 24 | 45 | 63 | 95 | 61 | 63 |
| 6 | 1 | 13 | 17 | 29 | 5 | 41 | 53 | 53 | 7 | 121 | 119 |
| 6 | 1 | 11 | 19 | 9 | 1 | 46 | 53 | 41 | 29 | 113 | 105 |
| 10 | 13 | 15 | 31 | 1 | 17 | 46 | 5 | 43 | 28 | 29 | 53 |
| 6 | 5 | 13 | 19 | 17 | 31 | 9 | 29 | 13 | 16 | 25 | 97 |
| 7 | 9 | 11 | 11 | 13 | 19 | 15 | 37 | 39 | 69 | 33 | 33 |
| 1 | 9 | 5 | 18 | 13 | 21 | 13 | 53 | 19 | 41 | 93 | 81 |
| 4 | 9 | 5 | 20 | 9 | 27 | 28 | 1 | 57 | 34 | 1 | 117 |
| 14 | 5 | 9 | 31 | 21 | 11 | 20 | 29 | 5 | 100 | 69 | 75 |
| 11 | 13 | 9 | 29 | 21 | 17 | 1 | 49 | 39 | 69 | 113 | 39 |
| 12 | 9 | 5 | 26 | 25 | 21 | 15 | 33 | 31 | 40 | 13 | 15 |
| 10 | 9 | 1 | 19 | 29 | 15 | 9 | 33 | 19 | 13 | 33 | 19 |
| 10 | 13 | 13 | 11 | 13 | 7 | 30 | 21 | 5 | 23 | 77 | 123 |
| 1 | 5 | 5 | 1 | 1 | 27 | 61 | 37 | 45 | 84 | 9 | 127 |
| 11 | 1 | 1 | 24 | 13 | 31 | 12 | 45 | 7 | 87 | 65 | 113 |
| 2 | 5 | 11 | 10 | 5 | 29 | 9 | 37 | 19 | 16 | 17 | 81 |
| 4 | 9 | 11 | 23 | 29 | 29 | 12 | 37 | 53 | 85 | 117 | 69 |
| 15 | 9 | 5 | 26 | 1 | 15 | 59 | 13 | 25 | 103 | 41 | 73 |
| 14 | 1 | 3 | 28 | 21 | 23 | 18 | 25 | 37 | 50 | 73 | 5 |
| 9 | 1 | 9 | 11 | 21 | 11 | 9 | 49 | 31 | 91 | 73 | 35 |
| 7 | 1 | 7 | 16 | 21 | 3 | 17 | 45 | 29 | 59 | 73 | 59 |
| 13 | 13 | 13 | 17 | 13 | 11 | 50 | 25 | 23 | 87 | 97 | 39 |
| 6 | 13 | 9 | 10 | 21 | 13 | 26 | 21 | 41 | 47 | 125 | 3 |
| 1 | 13 | 15 | 13 | 17 | 7 | 14 | 61 | 45 | 34 | 21 | 33 |
| 7 | 1 | 7 | 24 | 9 | 5 | 12 | 25 | 37 | 120 | 57 | 103 |
| 2 | 5 | 15 | 17 | 25 | 1 | 34 | 33 | 55 | 76 | 77 | 103 |
| 5 | 5 | 9 | 10 | 21 | 25 | 10 | 29 | 59 | 19 | 13 | 73 |
| 0 | 9 | 1 | 28 | 21 | 27 | 16 | 13 | 15 | 49 | 121 | 111 |
| 10 | 5 | 1 | 13 | 25 | 9 | 29 | 37 | 41 | 4 | 97 | 97 |
| 9 | 9 | 13 | 21 | 13 | 3 | 33 | 5 | 33 | 13 | 101 | 71 |
| 3 | 9 | 1 | 4 | 17 | 27 | 30 | 49 | 51 | 73 | 9 | 77 |
| 11 | 9 | 3 | 18 | 29 | 29 | 0 | 21 | 47 | 102 | 101 | 1 |

| K = 8192, 32 × 256 | | | K = 16384 32 × 512 | | | K = 32768, 32 × 1024 | | |
|---|---|---|---|---|---|---|---|---|
| x(0) | A | C | X(0) | a | c | x(0) | a | c |
| 40 | 37 | 249 | 181 | 45 | 289 | 939 | 281 | 913 |
| 73 | 53 | 59 | 75 | 217 | 223 | 9 | 85 | 969 |
| 88 | 177 | 105 | 251 | 125 | 257 | 463 | 989 | 165 |
| 46 | 29 | 91 | 89 | 141 | 457 | 363 | 981 | 59 |
| 199 | 73 | 141 | 304 | 29 | 31 | 637 | 437 | 751 |
| 211 | 185 | 133 | 328 | 153 | 161 | 599 | 597 | 621 |
| 85 | 193 | 181 | 428 | 17 | 451 | 971 | 173 | 615 |
| 18 | 169 | 209 | 394 | 245 | 147 | 1007 | 157 | 79 |
| 246 | 81 | 89 | 178 | 321 | 111 | 444 | 693 | 415 |
| 192 | 85 | 71 | 186 | 217 | 227 | 339 | 205 | 331 |
| 144 | 189 | 223 | 438 | 357 | 423 | 382 | 293 | 565 |
| 6 | 129 | 73 | 465 | 85 | 261 | 505 | 981 | 259 |
| 118 | 69 | 119 | 24 | 185 | 109 | 728 | 845 | 447 |
| 221 | 217 | 127 | 415 | 417 | 465 | 139 | 953 | 383 |
| 241 | 109 | 27 | 225 | 137 | 33 | 682 | 537 | 461 |
| 235 | 209 | 133 | 77 | 61 | 265 | 487 | 293 | 903 |
| 181 | 189 | 235 | 158 | 45 | 211 | 453 | 9 | 885 |
| 126 | 245 | 37 | 278 | 373 | 255 | 352 | 729 | 619 |
| 129 | 173 | 191 | 410 | 117 | 175 | 442 | 81 | 315 |
| 222 | 9 | 43 | 275 | 253 | 429 | 537 | 945 | 519 |
| 89 | 113 | 159 | 35 | 85 | 289 | 201 | 13 | 175 |
| 21 | 13 | 205 | 496 | 249 | 15 | 459 | 745 | 97 |
| 75 | 253 | 183 | 79 | 365 | 221 | 592 | 69 | 829 |
| 195 | 149 | 71 | 257 | 449 | 337 | 803 | 909 | 385 |
| 45 | 101 | 209 | 232 | 81 | 137 | 133 | 425 | 201 |
| 246 | 193 | 159 | 385 | 121 | 87 | 965 | 109 | 1001 |
| 228 | 85 | 97 | 138 | 429 | 73 | 707 | 685 | 105 |
| 0 | 161 | 151 | 479 | 9 | 23 | 627 | 289 | 97 |
| 191 | 45 | 31 | 158 | 141 | 51 | 1019 | 805 | 753 |
| 162 | 165 | 35 | 442 | 481 | 71 | 101 | 69 | 573 |
| 196 | 149 | 191 | 464 | 269 | 157 | 521 | 753 | 183 |
| 94 | 157 | 197 | 413 | 505 | 237 | 290 | 221 | 181 |

In an alternate embodiment, the coefficient a may be set equal to 1, with a new search being performed to obtain puncture-friendly interleavers of size $2^N$ from a 2-D, LCS interleaver. The forward and reverse LCS recursion equations simplify, respectively, to the following:

$$x(n+1)=(x(n)+c) \bmod M,$$

and $$x(n)=(x(n+1)-c) \bmod M.$$

Table 4, below, contains initial results of the search. For simplicity and efficiency in implementation, thirty-two rows were used for all interleavers. Those skilled in the art would understand from the results shown in Table 4 that setting a equal to 1 in all LCS recursions induces no penalty in the quality of the resulting interleavers. Moreover, the complexity gains achieved from the simplification of setting a equal to 1 are substantial. For example, the second and third LUTs described in the embodiment of FIG. 2 (the LUTs used to store the values of a and $a^b$) are not needed. The k-bit multipliers described in the embodiment of FIG. 2 are also not necessary. As can be seen from Table 4, below, only the initial condition x(-1) and the additive constant c need be specified for each row of the interleaver. Coefficients for the larger sized interleaver are not included in the table, which specifies initial search results only, because they were not available as of the time of filing of the present application.

In accordance with one embodiment, a serial stream of incoming bits is sent into two encoders, into one with no change and into the other via an interleaver. At the output of the two encoders, the parity symbols are multiplexed together into another output serial stream at some factor based on the code rate higher in data rate. If both coders were at a code rate of ½, meaning for every symbol coming in, two symbols come out, the rate coming out would be three times that going in because each coder would contribute one extra parity symbol plus the information system going out. As the information symbol out from each encoder is the same, one symbol is dropped.

Figure 4:
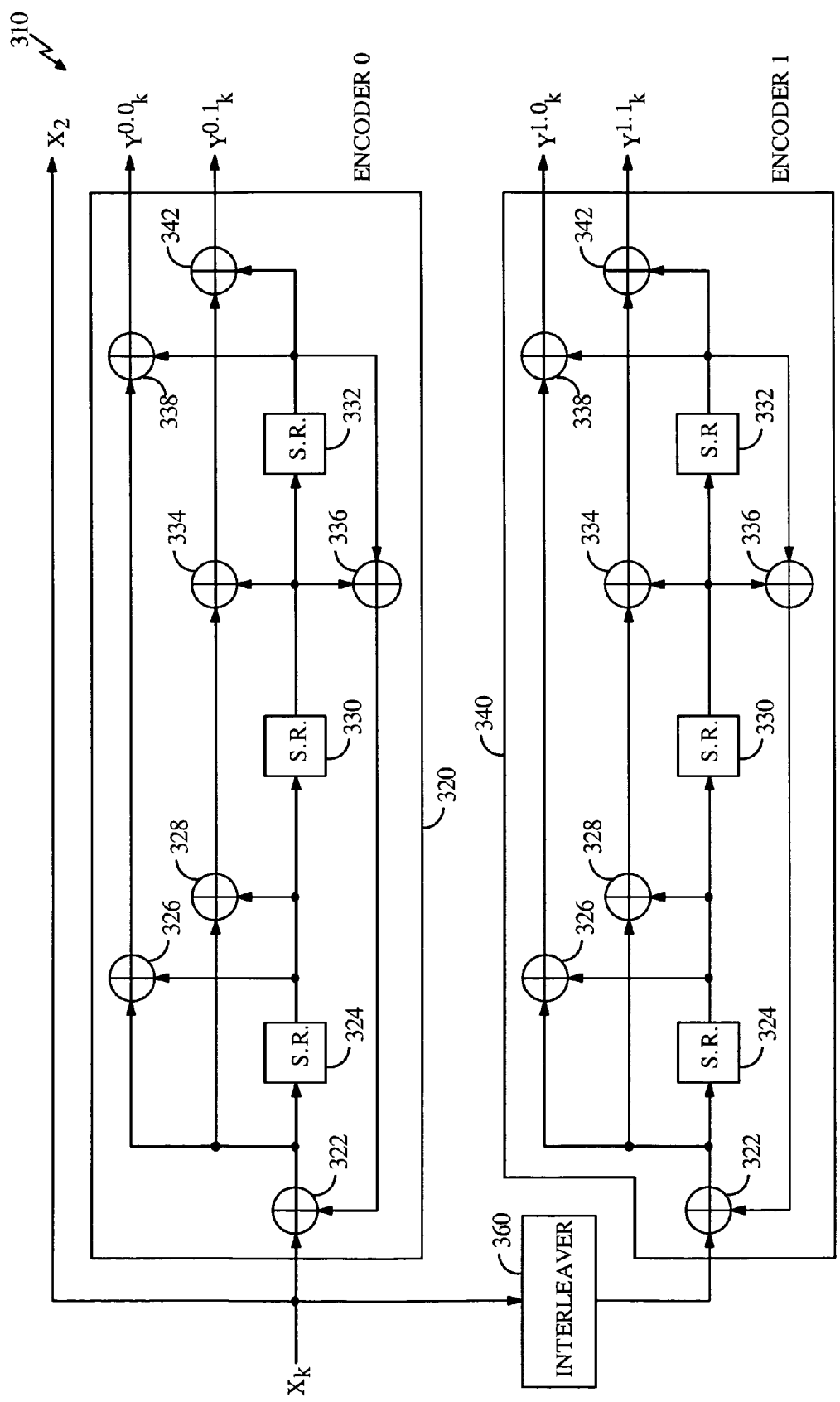
FIG. 4 is a top level block diagram showing a turbo encoder with two constituent convolutional encoders and an interleaver constructed in accordance with the present teachings.

FIG. 4 is a top level block diagram showing a turbo encoder 310 with two constituent convolutional encoders 320 and 340 and an interleaver 360 constructed in accordance with the present teachings. (Those skilled in the art will appreciate that the encoders need not be identical to practice the present invention.) Each constituent encoder 320 and 340 includes a first eXclusive-OR (XOR) gate 322. The XOR gate 322 provides the input terminal for each encoder 320 and 340. The XOR gate 322 is the first of several identical 2:1 XOR gates implemented in each encoder as a single one-bit adder. The output of the first XOR 322 is input to a first one bit shift register 324 and fed forward to second and third XOR gates

TABLE 4

2-D LCS Interleaver Coefficients

| K = 512, 32 × 16 | | K = 1024, 32 × 32 | | K = 2048, 32 × 64 | | K = 4096, 32 × 128 | | K = 8192, 32 × 256 | | K = 16384, 32 × 512 | | K = 32768, 32 × 1024 | |
|---|---|---|---|---|---|---|---|---|---|---|---|---|---|
| x(−1) | C | x(−1) | C | x(−1) | C | x(−1) | c | x(−1) | c | x(−1) | c | x(−1) | c |
| 1 | 1 | 1 | 3 | 0 | 5 | — | — | — | — | — | — | — | — |
| 11 | 9 | 14 | 1 | 1 | 1 | — | — | — | — | — | — | — | — |
| 11 | 15 | 5 | 13 | 14 | 1 | — | — | — | — | — | — | — | — |
| 1 | 5 | 13 | 27 | 3 | 23 | — | — | — | — | — | — | — | — |
| 1 | 5 | 3 | 17 | 9 | 25 | — | — | — | — | — | — | — | — |
| 6 | 7 | 3 | 13 | 8 | 3 | — | — | — | — | — | — | — | — |
| 6 | 15 | 25 | 5 | 4 | 1 | — | — | — | — | — | — | — | — |
| 12 | 11 | 3 | 23 | 57 | 61 | — | — | — | — | — | — | — | — |
| 14 | 13 | 2 | 19 | 0 | 5 | — | — | — | — | — | — | — | — |
| 15 | 7 | 1 | 13 | 60 | 49 | — | — | — | — | — | — | — | — |
| 13 | 15 | 8 | 5 | 1 | 9 | — | — | — | — | — | — | — | — |
| 4 | 5 | 25 | 9 | 47 | 55 | — | — | — | — | — | — | — | — |
| 15 | 5 | 14 | 9 | 20 | 25 | — | — | — | — | — | — | — | — |
| 14 | 5 | 11 | 23 | 34 | 19 | — | — | — | — | — | — | — | — |
| 12 | 3 | 17 | 13 | 46 | 1 | — | — | — | — | — | — | — | — |
| 3 | 15 | 19 | 13 | 52 | 13 | — | — | — | — | — | — | — | — |
| 14 | 13 | 4 | 39 | 8 | 75 | — | — | — | — | — | — | — | — |
| 8 | 19 | 17 | 35 | 35 | 67 | — | — | — | — | — | — | — | — |
| 12 | 15 | 24 | 27 | 48 | 51 | — | — | — | — | — | — | — | — |
| 14 | 11 | 28 | 23 | 57 | 47 | — | — | — | — | — | — | — | — |
| 14 | 11 | 29 | 19 | 59 | 35 | — | — | — | — | — | — | — | — |
| 6 | 27 | 12 | 51 | 24 | 103 | — | — | — | — | — | — | — | — |
| 7 | 31 | 14 | 59 | 29 | 115 | — | — | — | — | — | — | — | — |
| 2 | 23 | 4 | 47 | 9 | 91 | — | — | — | — | — | — | — | — |
| 1 | 27 | 2 | 55 | 4 | 107 | — | — | — | — | — | — | — | — |
| 2 | 15 | 5 | 27 | 11 | 55 | — | — | — | — | — | — | — | — |
| 13 | 7 | 26 | 11 | 52 | 19 | — | — | — | — | — | — | — | — |
| 9 | 3 | 19 | 3 | 38 | 7 | — | — | — | — | — | — | — | — |
| 12 | 11 | 24 | 23 | 49 | 47 | — | — | — | — | — | — | — | — |
| 14 | 15 | 28 | 31 | 56 | 63 | — | — | — | — | — | — | — | — |
| 11 | 19 | 22 | 35 | 45 | 67 | — | — | — | — | — | — | — | — |
| 12 | 15 | 25 | 27 | 50 | 51 | — | — | — | — | — | — | — | — |

326 and 328, respectively. The first one bit shift register 324 is one of several identical one bit shift registers implemented within each encoder.

The second inputs to the second and third XORs 326 and 328 are provided by the output of the first shift register 324. The output of the first shift register 324 is also provided to a second shift register 330. The third XOR gate 328 and the second shift register 330 provide first and second inputs to a fourth XOR gate 334. The second shift register 330 also outputs to a third shift register 332 and a fifth XOR gate 336. The second XOR gate 326 and the third shift register 332 provide first and second inputs to a sixth XOR gate 338. The fourth XOR gate 334 and the third shift register 332 provide first and second inputs to a seventh XOR gate 342.

Those skilled in the art will appreciate that, in the illustration, the encoders 320 and 340 are K=4 rate, ⅓ convolutional encoders with feed-forward generator polynomials of $15_{octal}$ and $17_{octal}$. The feed-back generator polynomial is $13_{octal}$. In the illustration, the turbo decoder's code polynomial is hard-wired to the CDMA2000 standard polynomials first released in late 1998. The disclosed embodiments are independent of the code polynomials or type of encoder.

In operation, the input stream of information bits, shown as $x_k$, are received by the first XOR gate 322, of the first encoder 320, and by the interleaver 360. The interleaver 360 permutes the input stream in the manner described more fully below and provides an input to the first XOR gate 322 of the second encoder 340. The input stream of information bits $x_k$ is fed straight through the encoders and provided as an output along with parity bits $y^{0,0}_k$ and $y^{0,1}_k$ for the first encoder 320 and $y^{1,0}_k$ and $y^{1,1}_k$ for the second encoder 340. (Those skilled in the art will appreciate that the encoder 320 is a 'systematic' encoder inasmuch as the input stream $x_k$ is passed there-through without alteration.) These five output signals are multiplexed into a serial stream and passed on to the next element in a transmitter (not shown).

Figure 5:
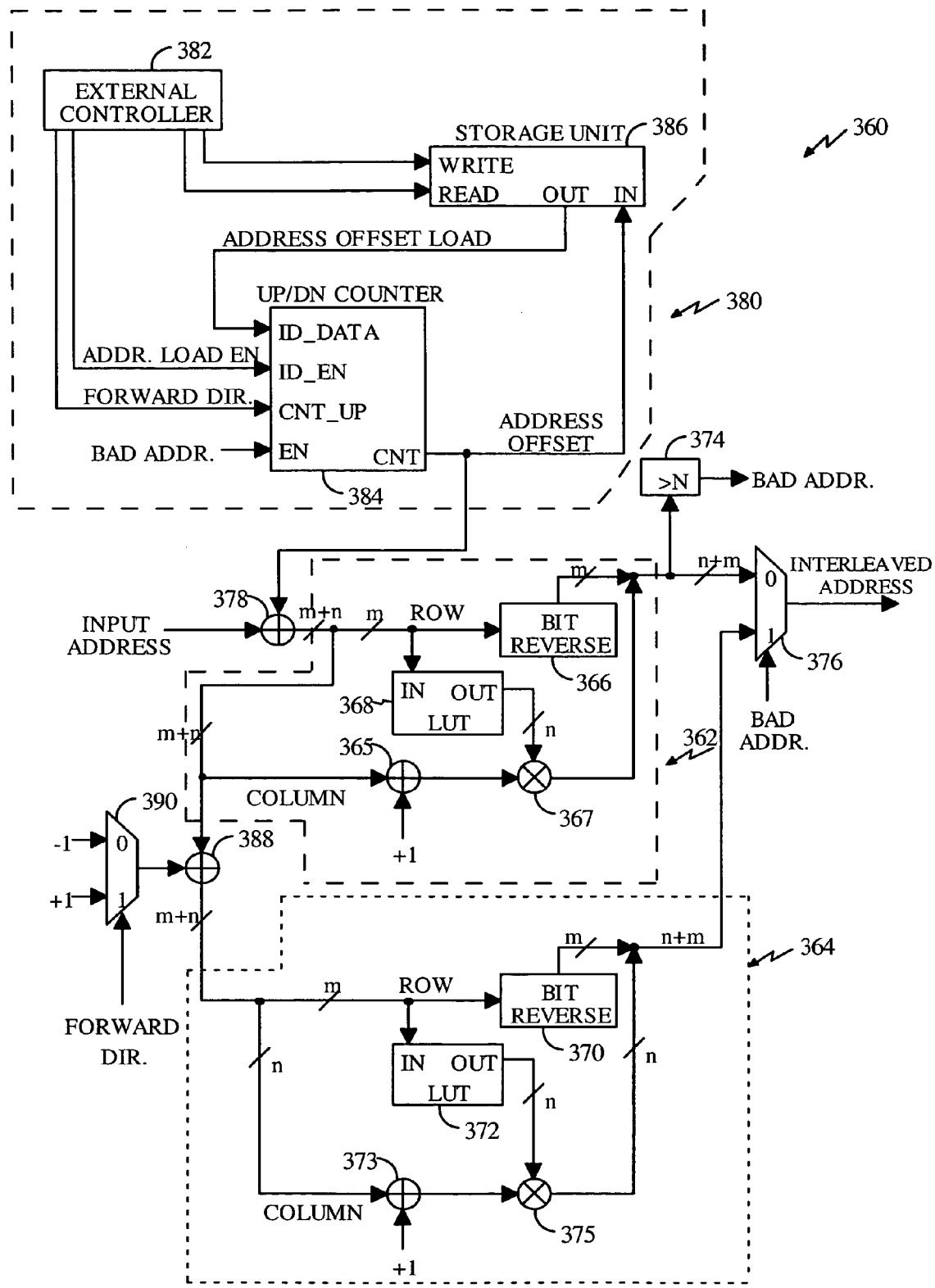
FIG. 5 is a simplified block diagram of showing the interleaver of FIG. 4 in detail.

FIG. 5 is a simplified block diagram showing the interleaver of FIG. 4 in detail. Because the inputs of the encoders 320 and 340 of FIG. 4 are permuted with respect to each other, error detection requires that the output of one encoder (e.g. 320) be permuted to match the input stream of the other decoder (340). Likewise, the output of the second decoder (340) must be deinterleaved to match the input stream of the first encoder (320).

The problem besetting practical implementation of simulated interleavers has to do with the requirement to generate the proper interleaver addresses inasmuch as the data addresses would otherwise become shuffled during the interleaving process. These functions are implemented by interleaver 360, which extracts proper addresses during the interleaving process.

In accordance with the present teachings, the interleaver 360 maps a linear address sequence into a permuted address sequence. The permuted addresses are generated in a manner similar to a bit reversal block interleaver except that the addresses in a given row of the block are further permuted using a linear congruential sequence (LCS). To generate the interleaved sequence of addresses, an R×C matrix is filled with the linear sequence of addresses starting with the top row, filling from left to right. The number of rows is R=32=$2^5$, the number of columns in the matrix is C=$2^c$. In this specific interleaver, the number of rows is fixed at 32, hence R equals $2^5$. 'C' is equal to the number of columns. For example, if the number of interleaver locations was 128, there would be four columns and 32 rows, and C would be equal to four. Next, the addresses within each row are shuffled according to a row-specific LCS. Then, the rows of the matrix are shuffled according to a bit reversal rule applied to the row index. Finally, the addresses are read out of the matrix by column starting with the left-most column, reading from top to bottom, and proceeding to the right. The LCS applied to each row is of the form:

$$x_i(n+1)=x_i(n)+c(i) \quad [1]$$

where i is the row index and c(i) is an odd constant modulo C. For the CDMA2000 turbo interleaver 60, the initial condition on each row is given by $x_i(0)=c(i)$, such that the above equation can be calculated without requiring the storage of the previous value. Thus, $$x_i(n)=c(i)\cdot(n+1) \quad [2]$$

Therefore, given an arbitrary address (A) in the linear address sequence: 0, . . . , K−1, corresponding interleaved address may be computed as follows:

$$A=\text{bitrev}(\text{row})\cdot 2^c+\{(col+1)\cdot c(i)\}\bmod C \quad [3]$$

where A is the interleaved address, 'row' is the 5 least significant bits (LSBs), 'col' is the c most significant bits (MSBs) of the input linear address, C is the number of columns and c(i) is the output of the lookup-table where "i" is the current row number. The c(i) coefficients are implemented as a lookup table (LUT). The interleaver 360 includes a separate lookup table for each supported value of C. To generate the interleaved sequence of addresses for an interleaver of size K subject to $2^{k-1}$<K<=$2^k$, the c(i) LUT is selected corresponding to C=$2^{k-5}$ and addresses are generated via Equation 3. Any addresses greater than K−1 are discarded. Due to the fact the interleaver is "read-out" by columns instead of rows, there can never be two or more consecutive bad addresses. In a linear array, the values would be read out by rows, meaning all of row 1 would be read out before row 2 is started. The present interleaver reads out by columns. This is specified in the interleaver equation by placing the row notation in the upper portion of the interleaver address. The lookup tables for interleaver sizes 512, 1024, . . . , 32768 may be found in the CDMA2000 standard.

The LCS interleaver must be punctured for non-power-of-2 interleaver lengths. In order to randomly access the interleaver, the amount of punctures prior to the access point must also be known and be able to be loaded into the interleaver function. In order to achieve high decoding rates, it is desirable to generate one valid interleaver address per clock cycle. As noted above, the interleaver algorithm of (Equation 3) cannot generate two consecutive invalid addresses. Aspects of the present invention take advantages of this property. As illustrated in FIG. 5, the interleaver 360 is implemented with dual computation units 362 and 364 each of which are designed to implement Equation 3. Each computation unit 362 and 364 includes a bit reversal unit 366, 370, a coefficient lookup table 368 and 372, an XOR Function 365, 373, and a modulo 2 adder 367, 375 respectively. The data computation paths are implemented in accordance with the above-noted CDMA2000 standard. That is, each computation unit is adapted to implement the algorithm of Equation 3 above.

The first computation unit 362 calculates the current interleaved address, while the second computation unit 364 calculates the next interleaver address. Therefore, the interleaver 360 can always produce a valid interleaved address every clock cycle.

If, at the output of first computation unit 362 the value of n+m<N, where n is the column address, m is the row address and N is the length of the interleaver, a bad address is detected by a threshold detector 374 which outputs a 'Bad Addr' signal. The Bad Addr signal output by the threshold detector 374 controls an interleaver select multiplexer 376. In response to the Bad Addr signal, the multiplexer 376 selects the output of the first computation unit 362 or the output of the second computation unit 364 as the output of the interleaver 360.

Each invalid address generated also increments an address offset counter 384. The address offset counter 384 is included in an address offset circuit 380 along with an external controller 382 and an address offset register 386 which may be implemented with a random access memory (RAM). The address offset circuit 380 manipulates an input linear address to account for the punctured addresses via a first adder 378. The support of random accesses is achieved through the use of a loadable address offset counter 384. Setting the address offset register 386 equal to the number of punctures prior to the random-access linear address in the interleaver array allows the interleaver 360 to be started from any location in an array of addresses.

A common method of implementing a turbo decoder is through the use of a log-MAP decoders for the constituent decoders. The log-MAP decoder requires forward and reverse iterations through the code trellis, which in turn, normally require the turbo interleaver to operate in both reverse and forward directions. Forward direction is defined as operating the interleaver from linear address 0 to the maximum required address. Conversely, the reverse direction is defined as running the interleaver from the highest linear address to linear address 0. It is possible to implement a log-MAP-based turbo decoder in such a manner which only requires forward interleaver operation, however, it is thought this would be extremely costly in terms of additional temporary storage. In order to reduce state metric memory storage requirements for the log-MAP decoder, log-MAP decoders are often implemented which utilize sliding windows. The use of sliding windows is facilitated by an interleaver which not only can run backwards but can also randomly access the interleaver array. For this reason, the interleaver 360 of the present invention is designed to run in a forward direction as well as a reverse direction.

In order to run in the reverse direction, the interleaver algorithm is left unchanged, but the input to the dual computation units is altered. Instead of the computation units operating on the input_address+address_offset and the input_address+address_offset+1 respectively, the dual computation units operate on input_address+address_offset and input_address+address_offset−1 respectively. This is implemented with a second adder 388 and a second multiplexer 390 under command of a forward reverse signal supplied by the decoder 400 of FIG. 6 as discussed more fully below. This signal comes from the decoder's control logic. That is, the decoder will determine whether or not it should operate the interleaver in the forward or reverse direction by the nature of the operation it is current performing.

In addition, to maintain the correct puncture count (or address offset), the address offset counter 384 is driven to function as a down counter by the controller 382 rather than an up counter as in the forward direction.

In short, the present teachings provide a unique implementation of the LCS turbo interleaver algorithm utilized by the CDMA2000 standard. The turbo interleaver implementation takes advantage of subtle characteristics of the CDMA2000 interleaver algorithm to produce a powerful design.

Figure 6:
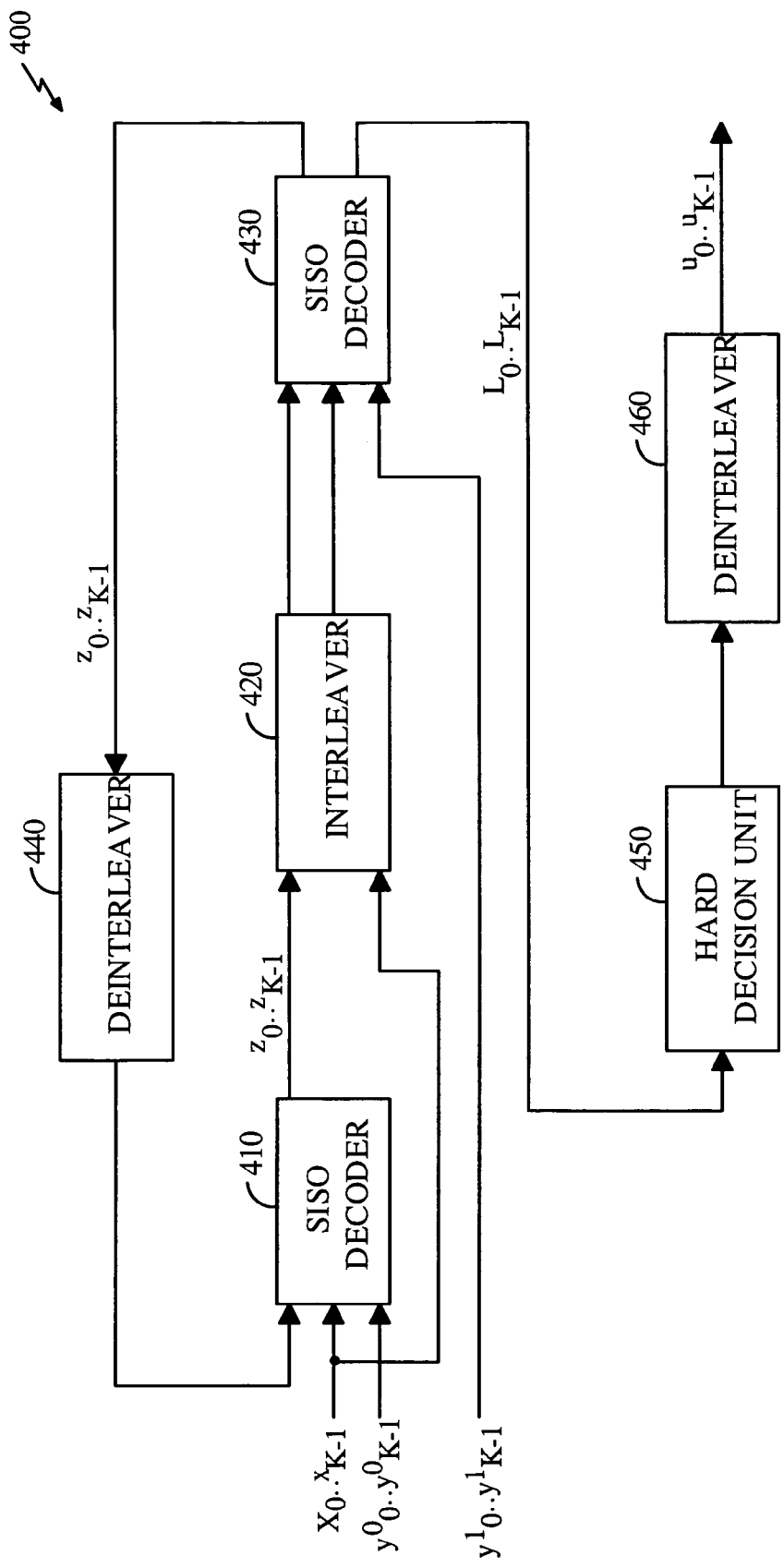
FIG. 6 is a block diagram of an illustrative implementation of a turbo decoder incorporating the teachings of the presently disclosed embodiments.

FIG. 6 is a block diagram of an illustrative implementation of a turbo decoder incorporating the teachings of the present invention. The turbo decoder 400 is of conventional design with the exception of the interleaver and deinterleavers which are implemented in accordance with the present teachings.

The turbo decoder 400 receives the five signals output by the encoder (typically over a channel) and implements an iterative process with feedback by which a first soft-input, soft-output (SISO) decoder 410 receives the data stream along with the non-interleaved parity bits and outputs to an interleaver 420.

In FIG. 6, $x_0 \ldots x_{K-1}$ is the information symbol vector, $y^0_0 \ldots y^0_{K-1}$ is the parity symbol vector from the first encoder 320 and $y^1_0 \ldots y^1_{K-1}$ is the parity symbol vector from the second encoder 340 of the turbo encoder 310 of FIG. 4. In addition, $z_0 \ldots z_{K-1}$ is the a priori information vector from each SISO decoder, $L_0 \ldots L_{K-1}$ is the log-likelihood ratio vector, and finally, $u_0 \ldots u_{K-1}$ is the decoded data bit vector.

The received interleaved signals along with the output of the local interleaver 420 are input to a second SISO decoder 430 with outputs to a first deinterleaver 440 and a second deinterleaver 460 via a hard decision unit 450. The local interleaver 420, the deinterleaver 440 and the deinterleaver 460 are implemented in the same manner as the interleaver 360 used in the turbo encoder 310.

The turbo decoder 400 decodes the output of one encoder (320 or 340) at a time. The SISO decoders 410 and 430 pass an error weighting between each other to provide to the next decoder a priori indication of what the decoding hard decision bits should be. In essence, the process is iterative in that each step provides incrementally more weighting to the next decoder to assist in the decoding process executed thereby. The work of each decoder 410 and 430 is therefore leveraged in the next decoding step.

The hard decision unit 450 serves to convert a soft output symbol to into a hard output bit as will be appreciated by those skilled in the art and may be implemented with a comparator as is common in the art. The output of the hard decision unit 450 is deinterleaved to provide the decoded data bit vector output of the decoder 400.

Thus, a novel and improved turbo code interleaver has been described. Those of skill in the art would understand that while the embodiments disclosed herein have been described in the context of a cellular telephone system, the features of the instant invention lend themselves equally well to application in any form of communications system, including, e.g., a satellite communications system. It would further be understood by those skilled in the art that the embodiments described herein may be used to encode either data or voice communications. It would also be understood that the data, instructions, commands, information, signals, bits, symbols, and chips that may be referenced throughout the above description are advantageously represented by voltages, currents, electromagnetic waves, magnetic fields or particles, optical fields or particles, or any combination thereof.

Those of skill would further appreciate that the various illustrative logical blocks and algorithm steps described in connection with the embodiments disclosed herein may be implemented or performed with a digital signal processor (DSP), an application specific integrated circuit (ASIC), discrete gate or transistor logic, discrete hardware components such as, e.g., registers and FIFO, a processor executing a set of firmware instructions, or any conventional programmable software module and a processor. The processor may advantageously be a microprocessor, but in the alternative, the processor may be any conventional processor, controller, microcontroller, or state machine. The software module could reside in RAM memory, flash memory, registers, or any other form of writable storage medium known in the art.

Thus, the present invention has been described herein with reference to a particular embodiment for a particular application. Those having ordinary skill in the art and access to the present teachings will recognize additional modifications, applications and embodiments within the scope thereof. It is therefore intended by the appended claims to cover any and all such applications, modifications and embodiments within the scope of the present invention.

What is claimed is:

1. An apparatus, comprising:
an interleaver arranged to receive the data for transmission and to reorder the same, in which interleaver the data for transmission is considered as a matrix formed by adding data to the matrix in row order, and during output the interleaver reorders the data for transmission such that the order of rows in the matrix is changed in accordance with a bit reversal algorithm, the order of data in each row of the matrix is pseudorandomly changed in accordance with a linear congruential sequence recursion such that at least two rows are changed in a different order, and the data is taken from the matrix in column order; and
a decoder coupled to the interleaver.

2. The apparatus of claim 1, wherein the interleaver includes means for implementing the expression:

$$A = \text{bitrev}(row) \cdot 2^c + \{(col+1) \cdot c(i)\} \bmod C,$$

wherein A is the first sequential interleaved address,
wherein beirev is a function that reverses order of bits in a row comprising the 5 least significant bits,
wherein col is the c most significant bits of the input address,
wherein mod is a function that returns a remainder when one number is divided by another, and C is the number of columns, and
wherein c(i) is the output of a lookup-table and "i" is the current row number.

3. The apparatus of claim 2, wherein said second means includes means for implementing the expression:

$$A = \text{bitrev}(row) \cdot 2^c + \{(col+1) \cdot c(i)\} \bmod C,$$

wherein A is the second sequential interleaved address,
wherein bitrev is a function that reverses order of bits in a row comprising the 5 least significant bits,
wherein col is the c most significant bits of the input inear address,
wherein mod is a function that returns a remainder when one number is divided by another, and C is the number of columns, and
wherein c(i) is the output of a lookup-table and "i" is the current row number.

4. The apparatus of claim 3, further comprising:
a plurality of look up tables storing coefficients, wherein one look up table corresponds to one column.

5. The apparatus of claim 1, further comprising:
a first encoder adapted to receive a first input; and
a second encoder adapted to receive an interleaved version of the first input.

6. The apparatus of claim 5, further comprising:
threshold detector for identifying bad addresses.

7. The apparatus of claim 6, wherein the threshold detector is adapted to output a bad address signal on detection of a bad address.

8. The apparatus of claim 7, further comprising:
a first address computation unit;
a second address computation unit; and
a multiplexer adapted to select one of the first and second address computation units in response to the bad address signal.

9. The apparatus of claim 8, wherein the first address computation unit calculates a current interleaver address and the second address computation unit calculates a next current interleaver address.

10. The apparatus of claim 1, wherein the decoder is a soft input soft output decoder.

11. The apparatus of claim 10, further comprising:
a second decoder coupled to the soft input soft output decoder.

12. The apparatus of claim 11, wherein the second decoder is a hard decision decoder.

* * * * *